United States Patent [19]

Watanabe et al.

[11] Patent Number: 5,367,979
[45] Date of Patent: Nov. 29, 1994

[54] MONOCRYSTAL GROWING METHOD

[75] Inventors: Masahito Watanabe; Minoru Eguchi, both of Tokyo, Japan

[73] Assignee: NEC Corporation, Japan

[21] Appl. No.: 4,439

[22] Filed: Jan. 14, 1993

[30] Foreign Application Priority Data

Jan. 24, 1992 [JP] Japan .................................. 4-011301

[51] Int. Cl.⁵ .............................................. C30B 15/30
[52] U.S. Cl. ....................................... 117/13; 117/14
[58] Field of Search ................ 156/605, 606, 617.1, 156/618.1, DIG. 89

[56] References Cited

U.S. PATENT DOCUMENTS

| | | | |
|---|---|---|---|
| 4,057,395 | 11/1977 | Schmidt et al. | 23/230 R |
| 4,915,773 | 4/1990 | Kravetsky et al. | 156/617.1 |
| 4,956,153 | 9/1990 | Yamagishi et al. | 156/617.1 |
| 5,131,974 | 7/1992 | Oda et al. | 156/617.1 |

OTHER PUBLICATIONS

"Influence of vertical stratification on motion in a differentially heated rotating annulus"; Boubnov, et al; *Geophysical and Astrophysical Fluid Dynamics;* (1988); vol. 42, No. 1-2, pp. 1-351.

*Primary Examiner*—R. Bruce Breneman
*Assistant Examiner*—Felisa Garrett
*Attorney, Agent, or Firm*—Laff, Whitesel, Conte & Saret

[57] ABSTRACT

In a method of growing a monocrystalline silicon based on the Czochralski method, the thermal Rossby number is set to at least 80 to develop the convection of a liquid of melted silicon in an axially symmetric form. A tube made of quartz is inserted in the silicon liquid to supply oxygen thereto to control the oxygen density of a resultant crystal. According to this method, there can be grown a silicon monocrystal which contains oxygen in an arbitrary density range from $10^{15}/cm^3$ to $10^{18}/cm^3$ and which has a uniform oxygen density variation not exceeding 5% in a plane vertical to a direction of the crystal growth.

4 Claims, 2 Drawing Sheets

MONOCRYSTAL GROWING METHOD

BACKGROUND OF THE INVENTION

The present invention relates to a method of growing a monocrystal of silicon according to a Czochralski method.

DESCRIPTION OF THE RELATED ART

Conventionally, when a monocrystal of silicon is grown in the Czochralski method, in order to control density of oxygen in the crystal and to obtain a uniform distribution of temperature in the liquid melted in a crucible, the crucible is rotated at a high rotary speed. However, when the crucible is turned in such a high rotary speed, convention of the melted liquid becomes to be unstable. Consequently, in the obtained crystal, there appear stripes due to irregular growth thereof. Namely, it is impossible to grow a monocrystalline silicon uniformly containing oxygen therein.

In the conventional method of growing a silicon monocrystal according to the Czochralski method, the density of oxygen in the crystal and the uniform temperature distribution in the melted liquid are controlled only by the rotary speed of the crucible. This however cannot control the convection of the liquid and hence there cannot be attained a monocrystal of silicon having a uniform distribution of oxygen therein.

SUMMARY OF THE INVENTION

It is therefore an object of the present invention to provide a monocrystal growing method in which the crystal contains oxygen in an arbitrary density range from $10^{15}/cm^3$ to $10^{18}/cm^3$ and which has a uniform oxygen density, namely, the variation thereof not exceeding 5% in a plane vertical to a direction of the crystal growth.

To achieve the object above, in the monocrystal growing method in accordance with the present invention, the thermal Rossby number is set to at least 30 when a monocrystal of silicon is grown according to the Czochralski method in which the oxygen density is controlled with a tube made of quartz inserted into the melted silicon.

In accordance with the present invention, the convection is developed in an axially symmetric contour in the melted liquid to be symmetric with respect to an axis thereof, thereby supplying oxygen uniformly into a plane perpendicular to a direction of crystal growth. For this purpose, the thermal Rossby number is set to at least 30. Moreover, a tube made of quartz in a cylindrical shape is inserted into the liquid to develop an oxygen density in an arbitrary range. According to the crystal growing method, there can be obtained a crystal containing oxygen in an arbitrary density range from $10^{15}/cm^3$ to $10^{18}/cm^3$ and having a uniform oxygen density variation not exceeding 5% in a plane vertical to a direction of the crystal growth.

In accordance with the present invention, when the thermal Rossby number is set to at least 30, the convection of the liquid is developed in an axially symmetric form, which has been confirmed in the X-ray radiography. In the convection formed in such a symmetric contour, oxygen mixed in the liquid is uniformly transported so that the oxygen density variation in the resultant crystal does not exceed 5% in a plane vertical to a direction of the crystal growth. The thermal Rossby number (RoT) is determined according to the following expression.

$$Ro_T = gd\beta \Delta T / \omega^2 r^2$$

where, letters g, $\beta$, $\Delta T$, d, r, and $\omega$ respectively stand for an acceleration of gravity, a coefficient of thermal expansion, a temperature difference, a height of the liquid, a radius of the liquid, and a rotary speed of the crucible. The thermal Rossby number can be considered a number without dimension representing an effect of the rotation of the crucible on the natural convection due to buoyancy. It can be considered that the greater the thermal Rossby number is, the more dominant the natural convection becomes, which hence facilitates the convection to be developed in an axially symmetric shape.

As above, in the convection of the liquid forming the axially symmetric flow, a portion of the quartz tube is melted as above in the liquid running in the symmetric flow, thereby growing a monocrystal of silicon having an arbitrary oxygen density in an arbitrary range from $10^{15}/cm^3$ to $10^{18}/cm^3$ and an oxygen density variation not exceeding 5% in a plane orthogonal to a direction of the crystal growth.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
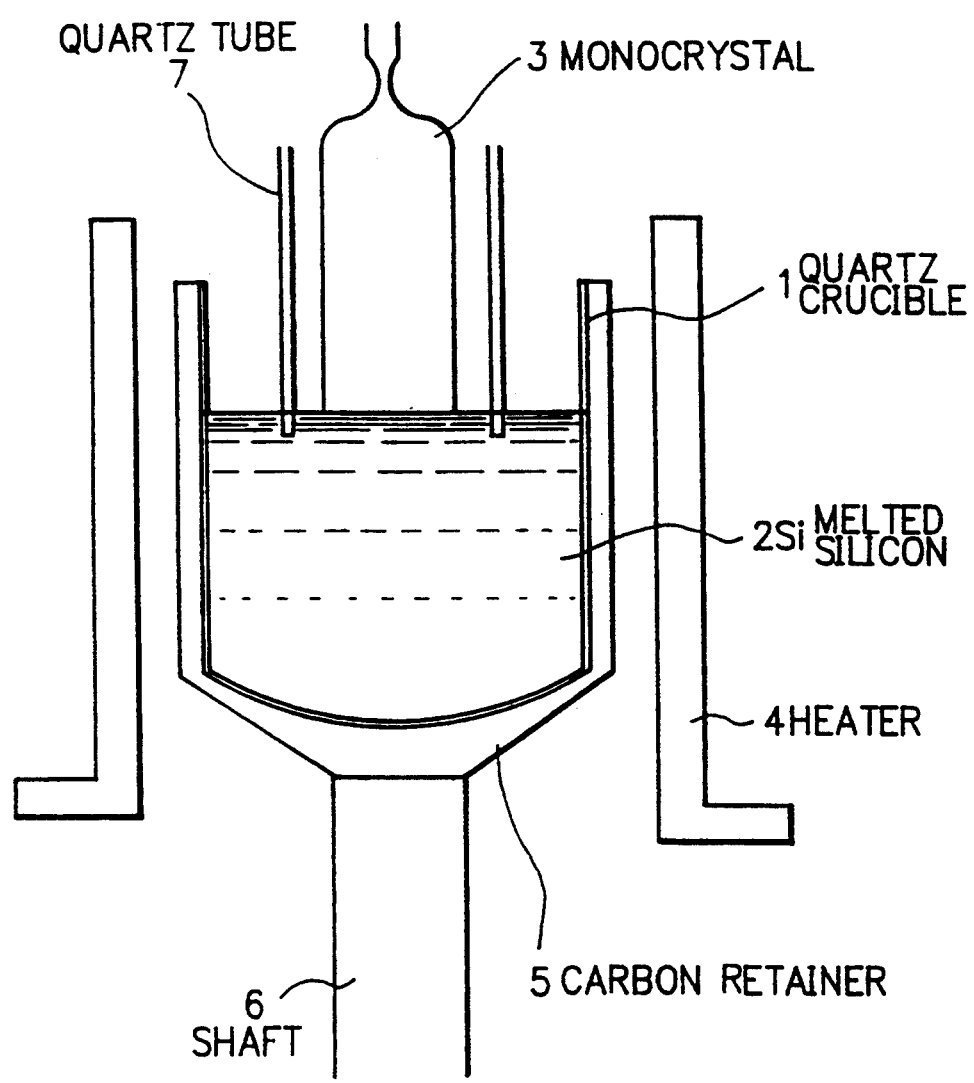
FIG. 1 is a conceptual diagram showing the constitution of an apparatus for growing a crystal in accordance with the present invention.

Referring now to the drawings, description will be given of embodiments in accordance with the present invention. FIG. 1 shows an apparatus for growing a crystal in an embodiment in accordance with the present invention. The system of FIG. 1 includes a quartz crucible 1 for keeping therein a solution of melted silicon, a silicon liquid 2, a silicon monocrystal 3, a heater 4, a carbon retainer 5 for fixedly retaining the quartz crucible 1, a shaft 6 for rotating the crucible 1, and a quartz tube 7 for supplying oxygen to the silicon liquid.

In this embodiment of the method of growing a monocrystal, there is employed a three-inch crucible 1 having a diameter of three inches and the silicon solution 2 is prepared such that the proportion of the radius of the liquid to the height or depth thereof is substantially 1:1 and the resultant silicon monocrystal 3 has a diameter of two inches. Under this condition, the rotary speed of the crucible 1 is varied from 0 rotations per minute (rpm) to 8 rpm in two cases of temperature discrepancy, namely, 55° K and 80° K between a highest temperature of the liquid 2 and a lowest one thereof.

Figure 2:
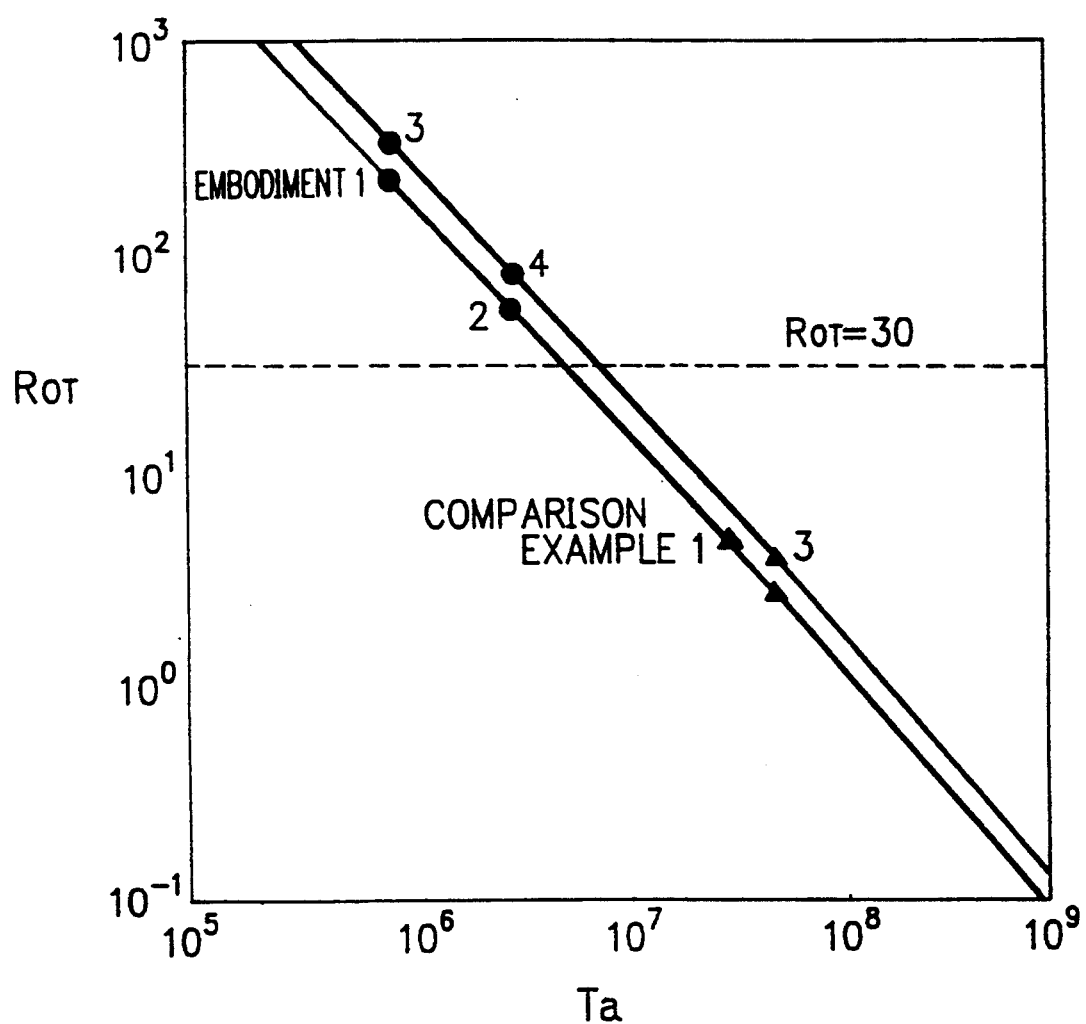
FIG. 2 is a graph for explaining a method of growing a crystal in accordance with the present invention.

Furthermore, to obtain an oxygen density $10^{16}/cm^3$, the quartz tube 7 is positioned to set a top thereof to be three meters apart from a surface of the liquid 2. FIG. 2 is a graph showing results of crystal growth in association with relationships between the conditions of growing the crystal represented in terms of the thermal Rossby number and the Taylor number.

Taylor number (Ta) is expressed as follows.

$$Ta = (r/d)4 \, \omega^2 r^4/\nu^2$$

where, $\nu$ designates a coefficient of kinematic viscosity of the silicon liquid. For the melted silicon, the coefficient of viscosity is almost unchanged with respect to a variation in the temperature and hence can be considered to be fixed. Consequently, the Tailor number is regarded as a number without dimension representing the shape and rotation speed of the solution. In this graph, each of lines drawn from the upper-left corner to the lower-right corner is associated with a fixed temperature difference.

According to this method, as embodiments of the present invention, monocrystals are grown under conditions indicated by points 1 to 4 denoted by small circles on the lines where the thermal Rossby number is at least 30. For each of the resultant crystals, measurements have been conducted for the variation in the oxygen density thereof in a plane vertical to the direction of crystal growth by a Fourier transform infrared absorption spectrometer (FT-IR) of a scanning type. Table 1 shows the measured values.

TABLE 1

| | Rotary speed of crucible (rpm) | Temperature difference (°K.) | Thermal Rossby No. | Variation density (%) |
|---|---|---|---|---|
| Embodiment | | | | |
| 1 | 1 | 55 | 230.0 | 2.5 |
| 2 | 2 | 55 | 56.1 | 3.8 |
| 3 | 1 | 80 | 330.3 | 2.0 |
| 4 | 2 | 80 | 82.4 | 3.5 |
| Comparison example | | | | |
| 1 | 6 | 55 | 6.3 | 13.5 |
| 2 | 8 | 55 | 3.5 | 20.8 |
| 3 | 8 | 80 | 5.2 | 17.9 |

Moreover, FIG. 2 shows results, denoted by small triangles, of silicon crystal growth under conditions where the thermal Rossby number is at most 30 and where the convection is formed in other than an axially symmetric contour. As can be seen from this table, in each silicon crystal grown when the thermal Rossby number is 30 or more, the variation in the oxygen density is restricted to be at most 5%.

In addition, description will be given of embodiments 5, 6, and 7. Setting the temperature of the liquid to 55° K. and fixing the rotary speed of the crucible to one rpm, the operation to grow monocrystalline silicon is accomplished by changing the position of the top of the quartz tube 7 relative to the surface of the liquid to adjust the amount of oxygen to be mixed therein. The distance between the top of the tube 7 and the liquid surface is selected as one, five, and ten millimeters. Resultant monocrystals are investigated by a Fourier transform infrared absorption spectrometer (FT-IR) of a scanning type to measure the oxygen density in the silicon monocrystal 3 and the variation in the oxygen density in a plane vertical to the direction of crystal growth. Table 2 shows the measured values.

TABLE 2

| Embodiment | Position of quartz tube (mm) | Oxygen density (/cm³) |
|---|---|---|
| 5 | 1 | $10^{15}$ |
| 6 | 5 | $10^{16}$ |
| 7 | 10 | $10^{18}$ |

As can be seen from Table 2, by moving the position of the top of the quartz tube 7 to alter the volume of oxygen mixed in the liquid, the oxygen density of the monocrystalline silicon 3 can be arbitrarily set in a range from about $10^{15}/cm^3$ to about $10^{18}/cm^3$.

Moreover, using a crucible 1 having a diameter of 15 inches and a crucible having a diameter of 20 inches, the monocrystal growth is conducted. In this case, the resultant crystals have diameters of eight and ten inches, respectively. In addition, to set the oxygen density to $10^{17}/cm^3$, the top of the quartz tube 7 is situated at a position seven millimeters apart from the liquid surface. As embodiments 7, 8, and 9, the crystal growth is achieved with the temperature discrepancy fixed to 55° K. and the thermal Rossby number selected to be at least 30. Table 3 shows measured results of the embodiments.

TABLE 3

| Embodiment | Diameter of crucible (inches) | Rotary speed of crucible (rpm) | Thermal Rossby number | Change in oxygen density (%) |
|---|---|---|---|---|
| 8 | 15 | 1 | 40.8 | 4.2 |
| 9 | 20 | 1 | 31.6 | 4.5 |
| 10 | 20 | 0.5 | 126.4 | 3.2 |

As shown in this table, also in the case where large-sized crucibles are used, it has been confirmed that when the thermal Rossby number is 30 or more, there can be obtained a monocrystal of silicon having a uniform oxygen density, namely, the variation in the oxygen density is at most 5%.

As above, it is confirmed that when the convection of the melted liquid is developed in an axially symmetric form, there can be grown a monocrystalline silicon having an oxygen density in an arbitrary range from $10^{15}/cm^3$ to $10^{18}/cm^3$ and a uniform oxygen distribution, namely, the variation in the oxygen density is at most 5% in a plane orthogonal to the direction of crystal growth.

In accordance with the present invention as described above, there is advantageously grown a uniform monocrystal of silicon according to the Czochralski method in which the variation in the oxygen density is at most 5% in a plane vertical to the direction of crystal growth.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A monocrystal growing method of growing a monocrystal of silicon based on a Czochraliski method comprising the steps of:

setting the Thermal Rossby number to 30 or more according to the following relationship:

$$Rot = gd\beta\Delta T/\omega^2 r^2$$

where:
   Rot = the Thermal Rossby number
   g = the acceleration of gravity
   $\beta$ = the Coefficient of thermal expansion
   $\Delta T$ = the temperature difference
   d = the height of the liquid r = the radius of the liquid ω = the rotary speed of the crucible; and inserting a tube made of quartz in a melted silicon liquid and supplying oxygen from the quartz tube to the liquid for controlling a density of oxygen in the monocrystal thus grown.

2. A method as claimed in claim 1, wherein a temperature difference between a highest and a lowest temperature of the liquid is in a range from about 55° K. to 80° K.

3. A method as claimed in claim 1, wherein a top of the quartz tube is about one to ten millimeters apart from a surface of the liquid for simultaneously controlling both the concentration and the fluctuation of the oxygen in the monocrystal growth.

4. A method as claimed in claim 1 wherein said Thermal Rossby number has a relationship with a Taylor number as set forth in FIG. 2.

* * * * *